(12) United States Patent
Wiesner et al.

(10) Patent No.: US 10,472,229 B2
(45) Date of Patent: Nov. 12, 2019

(54) MONOCRYSTALLINE EPITAXIALLY ALIGNED NANOSTRUCTURES AND RELATED METHODS

(75) Inventors: Ulrich Wiesner, Ithaca, NY (US); Michael Thompson, Ithaca, NY (US); Hitesh Arora, Ithaca, NY (US)

(73) Assignee: Cornell University—Cornell Center for Technology, Ithaca, NY (US)

( * ) Notice: Subject to any disclaimer, the term of this patent is extended or adjusted under 35 U.S.C. 154(b) by 0 days.

(21) Appl. No.: 13/582,525

(22) PCT Filed: Mar. 4, 2011

(86) PCT No.: PCT/US2011/027172
§ 371 (c)(1),
(2), (4) Date: Nov. 12, 2012

(87) PCT Pub. No.: WO2011/109702
PCT Pub. Date: Sep. 9, 2011

(65) Prior Publication Data
US 2013/0052421 A1     Feb. 28, 2013

Related U.S. Application Data

(60) Provisional application No. 61/311,098, filed on Mar. 5, 2010.

(51) Int. Cl.
*B81C 1/00* (2006.01)
*C30B 1/02* (2006.01)
(Continued)

(52) U.S. Cl.
CPC ......... *B81C 1/00031* (2013.01); *C30B 1/023* (2013.01); *C30B 29/08* (2013.01);
(Continued)

(58) Field of Classification Search
CPC . B82Y 30/00; C01G 53/00; Y10T 428/24174; Y10T 428/24182;
(Continued)

(56) References Cited

U.S. PATENT DOCUMENTS 4,088,515 A     5/1978   Blakeslee et al.
4,555,301 A  *  11/1985  Gibson ................... C30B 11/00
                                                             117/43
(Continued)

FOREIGN PATENT DOCUMENTS

WO      2009097184 A2     8/2009

OTHER PUBLICATIONS

Arora et al.; Block Copolymer Directed Nanoporous Metal Thin Films; Macromol. Rapid Commun. 2010,31-1960-1964; WILEY-VCH GMBH & Co. KGAA, Weinheim.
(Continued)

*Primary Examiner* — Megha M Gaitonde
(74) *Attorney, Agent, or Firm* — Bond, Schoeneck & King, PLLC; Blaine Bettinger; William Greener

(57) ABSTRACT

A method for fabricating a nanostructure utilizes a templated monocrystalline substrate. The templated monocrystalline substrate is energetically (i.e., preferably thermally) treated, with an optional precleaning and an optional amorphous material layer located thereupon, to form a template structured monocrystalline substrate that includes the monocrystalline substrate with a plurality of epitaxially aligned contiguous monocrystalline pillars extending therefrom. The monocrystalline substrate and the plurality of epitaxially aligned contiguous monocrystalline pillars may comprise the same or different monocrystalline materials. The method provides the nanostructure where when the monocrystalline substrate and the plurality of epitaxial aligned contiguous monocrystalline pillars comprise different monocrystalline
(Continued)

materials having a bulk crystal structure mismatch of up to about 10 percent, lattice mismatch induced crystal structure defects may be avoided interposed between the monocrystalline substrate and the plurality of epitaxially aligned contiguous monocrystalline pillars, which may have an irregular sidewall shape.

24 Claims, 10 Drawing Sheets

(51) Int. Cl.
- *C30B 29/08* (2006.01)
- *C30B 29/60* (2006.01)
- *H01L 21/02* (2006.01)
- *H01L 21/285* (2006.01)

(52) U.S. Cl.
CPC ...... *C30B 29/605* (2013.01); *H01L 21/02381* (2013.01); *H01L 21/02532* (2013.01); *H01L 21/02603* (2013.01); *H01L 21/02642* (2013.01); *H01L 21/28518* (2013.01); *B81C 2201/0149* (2013.01); *B81C 2201/0169* (2013.01); *Y10T 428/24372* (2015.01); *Y10T 428/24413* (2015.01)

(58) Field of Classification Search
CPC ..... Y10T 428/24479; Y10T 428/24537; Y10T 428/24612; Y10T 428/249953; Y10T 428/249967–24997; C30B 1/00; C30B 1/02; C30B 1/023
USPC ....... 428/119, 120, 145, 148, 149, 156, 167, 428/172, 304.4, 312.2, 312.6, 312.8, 428/318.4, 318.6; 977/701, 707, 720, 778
See application file for complete search history.

(56) References Cited

U.S. PATENT DOCUMENTS

| | | | |
|---|---|---|---|
| 5,006,914 A * | 4/1991 | Beetz, Jr. ................. 257/77 | |
| 6,592,764 B1 | 7/2003 | Stucky | |
| 6,592,991 B1 | 7/2003 | Wiesner | |
| 6,746,777 B1 | 6/2004 | Hwang | |
| 6,816,525 B2 | 11/2004 | Stintz et al. | |
| 7,001,669 B2 | 2/2006 | Yunfeng | |
| 7,190,049 B2 | 3/2007 | Tuominen | |
| 7,517,466 B2 | 4/2009 | Asakawa | |
| 7,709,574 B2 | 5/2010 | Wan | |
| 7,745,362 B2 | 6/2010 | Malenfant | |
| 7,799,416 B1 | 9/2010 | Chan | |
| 2004/0060897 A1 | 4/2004 | Mattes | |
| 2005/0019974 A1* | 1/2005 | Lutz et al. .............. 438/52 | |
| 2006/0278158 A1 | 12/2006 | Tolbert | |
| 2008/0090074 A1 | 4/2008 | Matsumura | |
| 2008/0187016 A1 | 8/2008 | Schowalter et al. | |
| 2008/0318003 A1 | 12/2008 | Chua et al. | |
| 2009/0092803 A1 | 4/2009 | Ion | |
| 2009/0121261 A1* | 5/2009 | Doris et al. .............. 257/288 | |
| 2009/0243584 A1* | 10/2009 | Zhang ............... B81C 1/00031 324/71.1 | |
| 2011/0003069 A1 | 1/2011 | Ho | |
| 2011/0017952 A1 | 1/2011 | Nobuyuki | |

OTHER PUBLICATIONS

Park et al.; Enabling nanotechnology with self assembled block copolymer patterns; Science Direct, Polymer 44 (2003) 6725-6760, Elsevier Ltd.
Li et al.; Block copolymer patterns and templates; Materials Today, Sep. 2006, vol. 9, No. 9.
Segalman, Rachel A.; Patterning with block copolymer thin films; Materials Science and Engineering R 48 (2005) 191-226, Elsevier B.V.
Hamley, I.W.; Ordering in thin films of block copolymers: Fundamentals to potential applications; Progress in Polymer Science 34 (2009) 1161-1210, Elsevier Ltd.
Kim et al.; Functional nanomaterials based on block copolymer self-assembly; Progress in Polymer Science 35 (2010) 1325-1349, Elsevier Ltd.
Farrell et al.; Self-Assembled Templates for the Generation of Arrays of 1-Dimensional Nanostructures: From Molecules to Devices; Journal of Colloid and Interface Science (2010), doi: 10.1016/j.jcis.2010.04.041.
Nedelcu et al.; Monolithic route to efficient dye-sensitized solar cells employing diblock copolymers for mesoporous $TiO_2$; J. Mater. Chem., 2010, 20, 1261-1268 | 1261.
Xia et al.; One-Dimensional Nanostructures: Synthesis, Characterization, and Applications; Adv. Mater. 2003, 15, No. 5, Mar. 4.
Aizenberg et al.; Direct Fabrication of Large Micropatterned Single Crystals; www.sciencemag.org, 299 (5610): 1205-1208.
Aizenberg et al.; Direct Fabrication of Large Micropatterned Single Crystals; Science 299, 1205 (2003).
Toberer, et al.; Epitaxial Manganese Oxide Thin Films with Connected Porosity: Topotactic Induction of Crystallographic Pore Alignment; Chemistry of Materials; vol. 19, No. 20: Oct. 2, 2007,pp. 4833-5044.
Shinhae, Choi; PCT International Search Report and Written Opinion; KIPO; dated Dec. 21, 2011.
Thomann, A.L., et al.; "Chemical and structural modifications of laser treated iron surfaces: investigation of laser processing parameters" Applied Surface Science 230 (2004); pp. 350-363.
Darif, M., et al; "Numerical Simulation of Si Nanosecond Laser Annealing by COMSOL Multiphysics"; Excerpt from the Proceedings of the COMSOL Conference 2008 Hannover; 6 pages.
Matthews, J.W., et al.; "Defects in Epitaxial Multilayers I. Misfit Dislocaitons"; Journal of Crystal Growth 27 (1974); copyright North-Holland Publishing Co.; pp. 118-125.
Matthews, J.W., "Defects associated with the accommodation of misfit between crystals"; Journal of Vacuum Science and Technology, vol. 12, No. 1, Jan./Feb. 1975; published by the American Vacuum Society; 9 pages.
Matthews, J.W. et al., "Accommodation of Misfit Across the Interface Between Crystals of Semiconducting Elements or Compounds"; Journal of Applied Physics, vol. 41, No. 9, Aug. 1970; copyright 1970 The American Institute of Physics; pp. 3800-3804.
Matthews, J.W., et al., "Defects in Epitaxial Multilayers II. Dislocation Pile-Ups, Threading Disclocations, Slip Lines and Cracks"; Journal of Crystal Growth 29 (1975); North-Holland Publishing Co.; pp. 273-280.
Matthews, J.W., et al., "Defects in Epitaxial Multilayers III. Preparation of almost perfect multilayers"; Journal of Crystal Growth 32 (1976); North-Holland Publishing Co.; pp. 265-273.
Baeri, P., et al.; "Laser annealing of silicon"; Materials Chemistry and Physics 46 (1996); copyright 1996 Elsevier Science S.A.; pp. 169-177.

* cited by examiner

MONOCRYSTALLINE EPITAXIALLY ALIGNED NANOSTRUCTURES AND RELATED METHODS

CROSS-REFERENCE TO RELATED APPLICATION

This application is a bypass continuation-in-part (CIP) application that is related to, and derives priority from, International Application Number PCT/US11/27172, filed 4 Mar. 2011 and titled "Monocrystalline Epitaxial Aligned Nanostructures and Related Methods," which in turn is related to, and derives priority from, U.S. Provisional Patent Application Ser. No. 61/311,098, filed 5 Mar. 2010 and titled "Method for Large Mismatch Heteroepitaxy on Silicon," the content of which is incorporated herein fully by reference.

STATEMENT OF GOVERNMENT INTEREST

This work was supported by the National Science Foundation under grant number DMR 0404195. The U.S. Government has rights in the invention claimed herein.

BACKGROUND

Nanostructures are often layered structures that may include different crystalline material layers. Nanostructures, and in particular semiconductor nanostructures, are desirable insofar as nanostructures often exhibit desirable and unique optical or electrical properties that allow for enhanced performance of nanostructure devices, such as semiconductor nanostructure devices, that comprise those nanostructures.

While nanostructures, and in particular semiconductor nanostructures, are thus desirable within the microelectronics fabrication art, nanostructures are nonetheless not entirely without problems. In that regard, insofar as nanostructures may be fabricated from different crystalline material layers, nanostructures are often susceptible to crystal structure defects.

Thus, desirable within the microelectronics fabrication art are methods and materials that may be used to provide nanostructures, and in particular semiconductor monocrystalline nanostructures, with inhibited crystal structure defects.

SUMMARY

Embodiments are directed to nanostructures having inhibited lattice mismatch induced crystal structure defects and methods for fabricating the foregoing nanostructures having the inhibited lattice mismatch induced crystal structure defects.

Methods for fabricating the foregoing nanostructures having the inhibited lattice mismatch induced crystal structure defects utilize a monocrystalline substrate having a template formed thereupon that includes a plurality of pores, to provide a templated monocrystalline substrate. Exposed portions of the templated monocrystalline substrate within the plurality of pores may optionally be treated to provide a cleaned templated monocrystalline substrate. Optionally also, an amorphous material layer may be formed upon the cleaned templated monocrystalline substrate. The templated monocrystalline substrate, with or without cleaning and with or without the amorphous material layer, is then energetically treated (i.e., typically but not exclusively thermally treated, such as but not limited to laser anneal thermally treated) to provide a templated structured monocrystalline substrate that comprises the monocrystalline substrate and a plurality of monocrystalline pillars within the plurality of pores within the template that are epitaxially aligned to and contiguous with the monocrystalline substrate.

The foregoing methods allow for fabrication of a nanostructure comprising a monocrystalline substrate having a first crystal structure and a plurality of epitaxially aligned contiguous monocrystalline pillars extending from the monocrystalline substrate and having a bulk second crystal structure having potentially a different lattice constant and/or lattice structure than the first crystal structure. The first crystal structure and the bulk second crystal structure may have a crystal structure mismatch as great as about 10 percent (i.e., from about 0.1 to about 10.0 percent or from about 5.0 to about 10.0 percent, and typically from 0.1 to about 4.0 percent), absent lattice mismatch induced crystal structure defects interposed between the monocrystalline substrate and the plurality of monocrystalline pillars that are epitaxially aligned to the monocrystalline substrate. The plurality of epitaxially aligned contiguous monocrystalline pillars will each also have a linewidth from about 5 to about 50 nanometers (more typically from about 10 to about 30 nanometers) and a separation distance from about 5 to about 100 nanometers (more typically from about 10 to about 50 nanometers and most typically from about 10 to about 30 nanometers), while inhibiting any lattice mismatch induced crystal structure defects interposed between the monocrystalline substrate and the plurality of epitaxially aligned contiguous monocrystalline pillars.

The foregoing methods also allow for fabrication of nanostructures having irregularly shaped pillars or other structures (i.e., with other than straight sidewalls and also with non-smooth sidewalls) comprising a monocrystalline material that is epitaxially aligned with a monocrystalline substrate. The aggregate of such irregularly shaped pillars may provide a nanostructured porous layer of circuitous (i.e., other than straight) porosity having a thickness from about 1 nanometer to about 10 microns (i.e., as low as about 1 to about 10 nanometers and a high as about 1 to about 10 microns) located upon a monocrystalline substrate of the same or different monocrystalline material as the plurality of epitaxially aligned pillars (which are also intended to include other structures).

Within the foregoing, a "linewidth" is intended as a dimension that is not necessarily limited to a line shaped structure, where the dimension encompasses both x and y projected dimensions with respect to a plane of a monocrystalline substrate, where a z dimension is perpendicular to the plane of the monocrystalline substrate. In addition, within the context of inhibiting any lattice mismatch induced crystal structure defects interposed between the monocrystalline substrate and the plurality of epitaxially aligned contiguous monocrystalline pillars in accordance with the embodiments, methods in accordance with the embodiments may be regarded as defect inhibited heteroepitaxy methods that provide defect inhibited heteroepitaxially aligned nano structures.

Within the embodiments, a percentage crystal structure mismatch between a monocrystalline substrate having a first crystal structure and a plurality of epitaxially aligned contiguous monocrystalline pillars extending from the monocrystalline substrate and having a second crystal structure different than the first crystal structure is calculated by the ratio of the difference in the commensurate lattice constants (spacing) to the average of the lattice constants of the bulk materials.

Similarly, an epitaxial alignment of a monocrystalline substrate and a plurality of monocrystalline pillars extending from the monocrystalline substrate is determined using transmission electron microscopy (TEM) analysis techniques and scanning transmission electron microscopy (STEM) analysis techniques as described below within the context of discussion of FIG. 3.

The embodiments also contemplate nanostructured substrates in accordance with the embodiments that are derived from the methods for fabricating nanostructures in accordance with the embodiments.

A particular method for forming a nanostructure in accordance with the embodiments includes forming upon a monocrystalline substrate a template comprising a plurality of pores to provide a templated monocrystalline substrate. This particular method also includes energetically treating the templated monocrystalline substrate to form a templated structured monocrystalline substrate comprising a plurality of monocrystalline pillars within the plurality of pores within the template that are epitaxially aligned to and contiguous with the monocrystalline substrate.

Another particular method for fabricating a nanostructure in accordance with the embodiments includes forming upon a monocrystalline substrate a template comprising a plurality of pores to provide a templated monocrystalline substrate. This particular method also includes forming upon the templated monocrystalline substrate an amorphous material layer. This particular method also includes energetically treating the templated monocrystalline substrate and the amorphous material layer to form a templated structured monocrystalline substrate comprising a plurality of monocrystalline pillars within the plurality of pores within the template that are epitaxially aligned to and contiguous with the monocrystalline substrate.

A particular nanostructure in accordance with the embodiments includes a monocrystalline substrate comprising a first monocrystalline material having a first crystal structure. This particular nanostructure also includes a plurality of monocrystalline pillars located epitaxially aligned to and contiguously upon the monocrystalline substrate and having a bulk second crystal structure with a mismatch as large as +/−10 percent with respect to the first crystal structure, absent any lattice mismatch induced crystal structure defects interposed between the monocrystalline substrate and the plurality of contiguous monocrystalline pillars.

Another particular nanostructure in accordance with the embodiments includes a monocrystalline substrate comprising a first monocrystalline material having a first crystal structure. This other particular nanostructure also includes a plurality of irregular sidewall shaped monocrystalline pillars located epitaxially aligned contiguously upon the monocrystalline substrate.

BRIEF DESCRIPTION OF THE DRAWINGS

The objects, features and advantages of the embodiments are understood within the context of the Detailed Description of the Embodiments, as set forth below. The Detailed Description of the Embodiments is understood within the context of the accompanying drawings, which form a material part of this disclosure, wherein.

DETAILED DESCRIPTION OF THE EMBODIMENTS

The embodiments, which include a plurality of methods for fabricating epitaxially aligned monocrystalline nanostructures, and the related epitaxially aligned monocrystalline nanostructures that result from the methods, are understood within the context of the description set forth below. The description set forth below is understood within the context of the drawings described above.

The description that follows is divided into sections that sequentially describe: (A)(1) Experimental Observations; (2) Experimental Materials and Methods; (3) Features and Advantages; and (4) Potential Applications, of the methods and the nanostructures in accordance with a first embodiment. The description that follows is also divided into additional sections that sequentially describe: (B)(1) Experimental Observations; and (2) Experimental Materials and Methods of the methods and the nanostructures in accordance with a second embodiment.

A. First Embodiment

1. Experimental Observations

This embodiment used nanoporous thin films ~15 to 100 nm thick on Si to define and control epitaxial crystallization of Si and NiSi, with templates having periodicities on the scale of tens of nanometers. Template thin films were obtained in a bottom-up self-assembly approach using inorganic precursors, a process directed by block copolymer self-assembly. Template pores (i.e., open ended apertures) were filled with amorphous Si or NiSi (a-Si or a-NiSi).

Subsequently, laser-induced melting converted the amorphous phase into crystalline materials. Depending on template thickness, either arrays of isolated nanopillars or interconnected three dimensional nanostructures (i.e., interconnected nanopillars) were generated.

Figure 1:
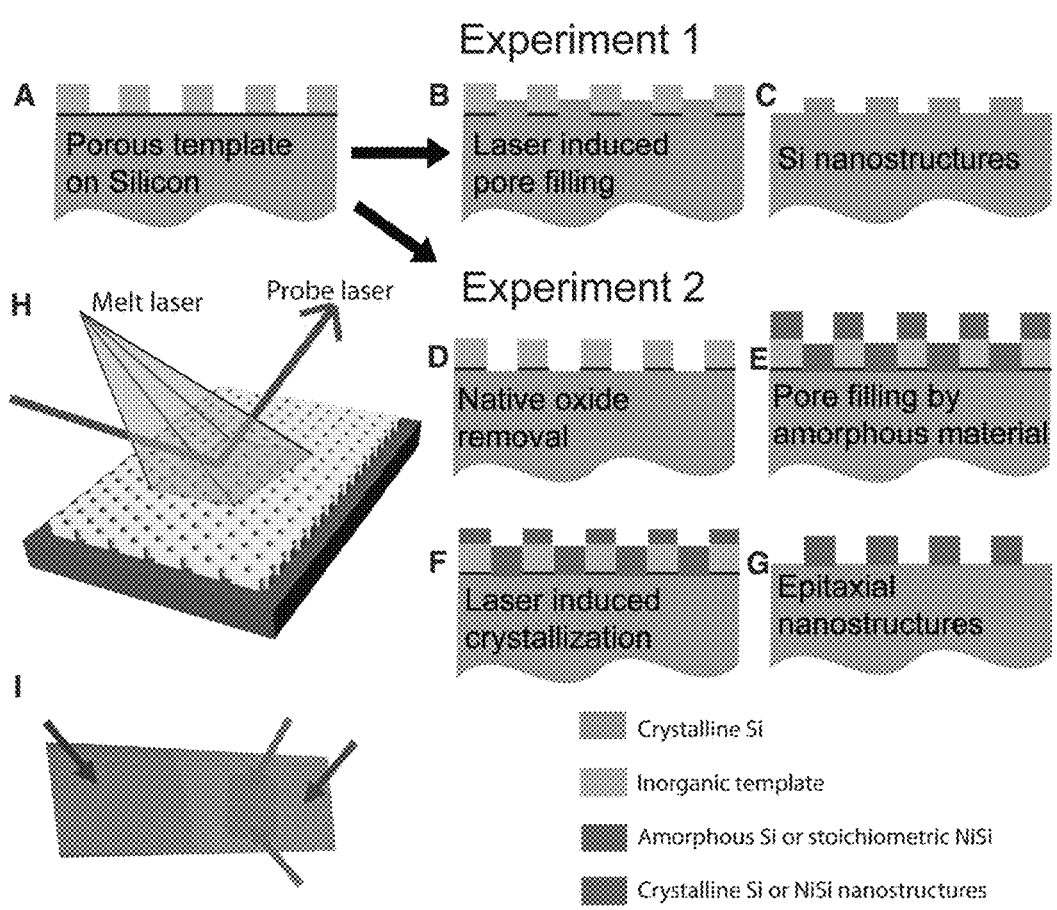
FIG. 1 shows a series of schematic cross-sectional and perspective-view diagrams illustrating progressive stages in fabricating a homoepitaxial silicon nanostructure and/or a heteroepitaxial nickel silicide on silicon nanostructure in accordance with a first embodiment.

The processes used are schematically shown in FIG. 1, A to H. In the first part of this study, bare Si wafers were spin-coated with a mixture of prehydrolyzed metal alkoxides [(3-glycidyloxypropyl-) trimethoxysilane and aluminum sec-butoxide, in a ratio of 8:2 by weight] and poly(isoprene-ethylene oxide) (PI-b-PEO) diblock copolymers (ratio of metal alkoxides to polymer, 6:1 by weight) in organic solvents (tetrahydrofuran:chloroform, 1:1 by weight). Monolayers with inverse hexagonal nanostructure were formed, with one inorganic-rich domain (PEO+inorganic) and the other purely organic (PI). The organic components were subsequently removed by slow heating to 500° C., leaving an ordered nanoporous hexagonal array, with pores accessible from the top, FIG. 1A. For the block copolymers used, the nanopore lattice spacings were between 30 and 35 nm, depending on the polymer molecular weight. The physical film thickness after calcination was 16+/−1.6 nm, as determined by a combination of scanning electron microscopy (SEM) and x-ray diffraction. The nanopores were initially filled with Si through the use of 40-ns XeCl excimer pulsed laser irradiation [wavelength (1)=308 nm] (FIG. 1H). The template itself was transparent, with the laser light being absorbed by the Si substrate. Time resolved reflectance (TRR) of the sample surface was monitored with a diode probe laser (1=650 nm) and was used to measure melt duration. At fluencies above the melt threshold (~600 mJ/cm$^2$ for Si), the semiconducting solid became a metallic liquid, and the surface reflectance increased sharply, providing a fingerprint for understanding the mechanistic details of the process.

Figure 2:
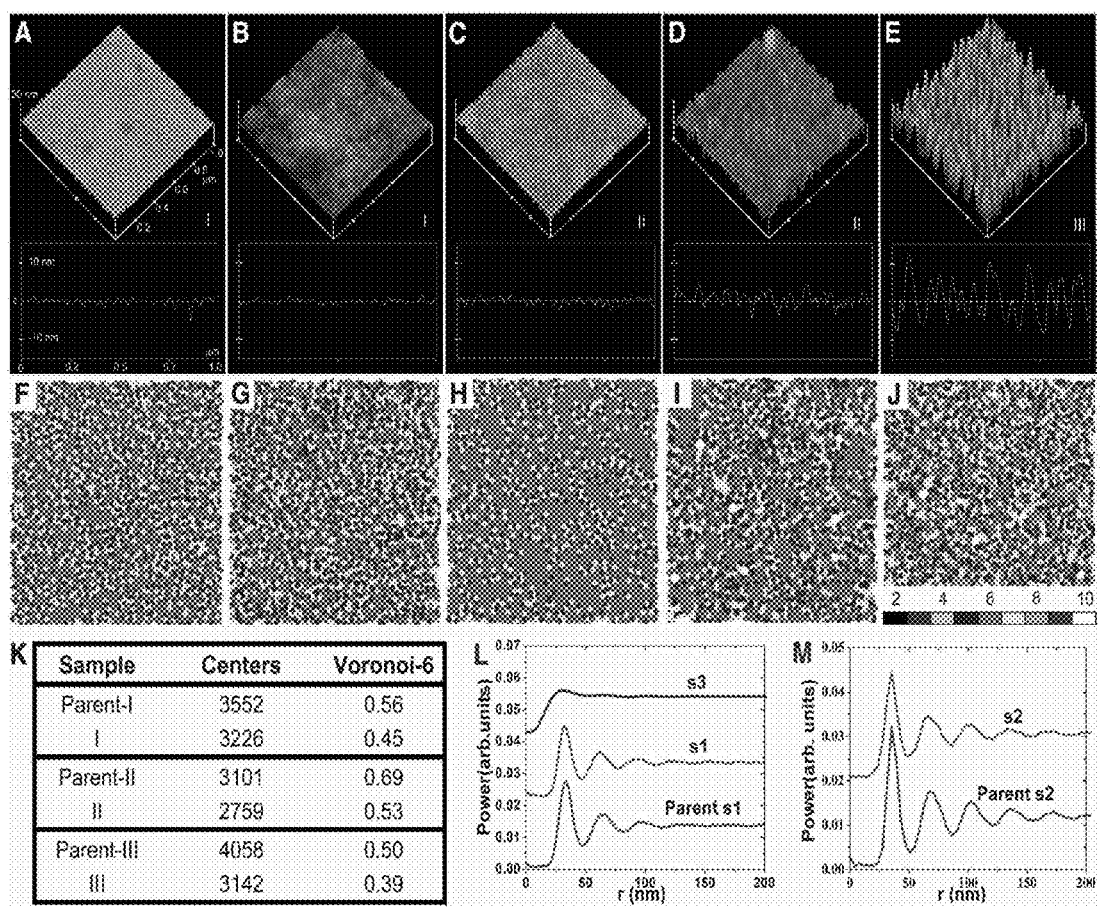
FIG. 2 shows a series of atomic force microscopy (AFM) images and related images and graphs pertaining to homoepitaxial silicon nanostructures that may be fabricated in accordance with the first embodiment.

In first experiments, with sample s1, the porous template was irradiated with the excimer laser at fluences sufficient to melt the underlying Si substrate. Because of rapid cooling into the substrate, the total melt duration was only ~20 to 100 ns, and the total time at higher temperatures was less than a few microseconds, preventing sintering collapse of the porous silica-type template. After laser irradiation, the aluminosilicate template was dissolved away with a 48% hydrofluoric acid (HF) solution to expose the resulting array of Si nanopillars (FIG. 1, B and C). FIG. 2, A and B, show atomic force microscopy (AFM) images of sample s1 before and after irradiation with five laser pulses of 40 ns duration and the subsequent removal of the skeletal aluminosilicate. The AFM results suggest excellent pattern transfer from the template into Si. The images were quantitatively analyzed with conventional image analysis tools. FIG. 2, F and G, show representative Voronoi diagrams of the aluminosilicate template and the resulting nanostructured Si array, respectively. The Voronoi diagram represents the number of nearest neighbors of a pore or resulting Si nanostructure after melting and may also be color-coded to facilitate identification of defects and grain boundaries. The Voronoi-6 ratio, defined as the fraction of pores or resulting Si nanostructures with sixfold hexagonal nearest-neighbor symmetry, provides a simple metric for sample comparison. As indicated by the increased number of defects in the Voronoi diagram, the transformation from pores to Si nanopillars increases disorder in the system. However, transfer of the template into Si structures was accomplished with a high yield, with greater than 90% conversion of pores to Si nanopillars and only a 20% decrease in the Voronoi-6 ratio (FIG. 2K, sample s1).

Although in these experiments the transfer fidelity was high in the lateral dimensions, section analysis of AFM images showed the resulting Si nanostructures to be only 1 to 2 nm high (see height profile in FIG. 2B). This motivated the development of a second, modified, process in subsequent experiments, enabling better filling of the pores and thus forming taller Si nanopillars. To this end, an a-Si overlayer (FIG. 1, D to G) was deposited onto the template before laser irradiation. Furthermore, the native oxide present at the bottom of the pore was first removed by Ar ion sputtering before a-Si deposition in the same chamber and at the same base pressure. This resulted in a clean interface between deposited a-Si in the pore and the crystalline Si (c-Si) substrate (FIG. 1E). Laser irradiation at an energy density above the melt threshold of c-Si of sample films (sample s2) prepared in this way resulted in epitaxial crystallization of Si nanopillars from the substrate inside the pore (FIG. 1F). Subsequent aqueous HF (48%) treatment removed the oxide template, leaving behind an array of single-crystal nanopillars (FIG. 1G). The AFM image and Voronoi analysis (FIG. 2, C and D, and H and I, respectively) of the template and pillar array confirmed 89% pattern transfer and only a 23% decrease in the Voronoi-6 ratio (FIG. 2K, sample s2). The average height of pillars was found to be 6 to 7 nm, which is substantially higher than before (see height profile in FIG. 2D).

Figure 3:
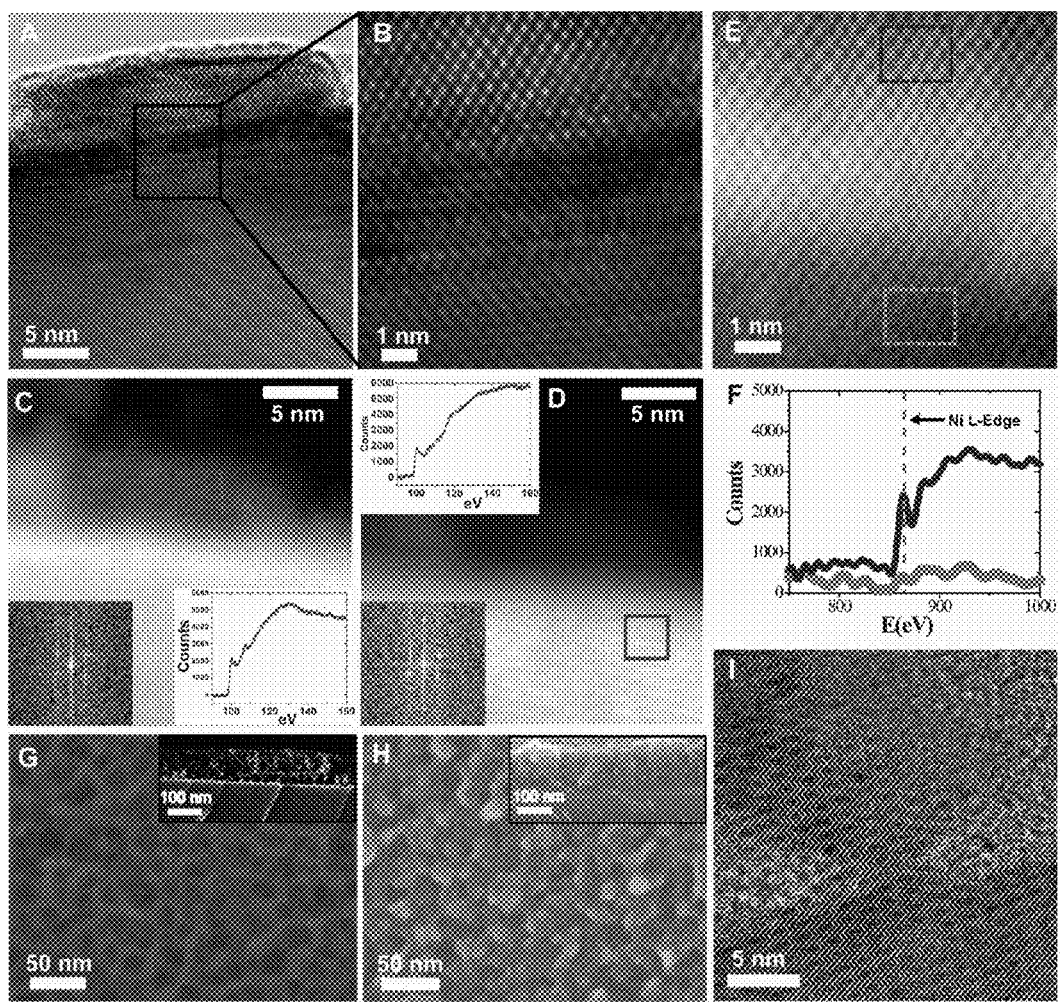
FIG. 3 shows a series of electron microscopy (EM) images of homoepitaxial silicon nanostructures and heteroepitaxial nickel silicide on silicon nanostructures that may be fabricated in accordance with the first embodiment.

The epitaxial crystallinity of the Si nanopillars was confirmed by imaging pillar cross sections with high-resolution TEM and scanning TEM (STEM) (FIG. 3). The presence of lattice fringes in the pillars in congruence with the fringes in the substrate (FIG. 3, A and B) shows the crystalline nature of the nanopillars. The epitaxial growth of the nanopillars was confirmed by STEM-mode imaging, in which the Si substrate and nanopillar are both shown to be aligned along the [110] zone axis (FIG. 3, C and D). The two-dimensional fast Fourier transform (FFT) patterns on the pillar and substrate (lower left insets in FIG. 3, C and D, respectively) show that the two areas share the [111] reflections. Because of an offset in depth that exceeded the depth of field of the microscope for 0.3-nm fringes, STEM-mode images were taken with only the pillar (FIG. 3C) and only the substrate (FIG. 3D) in focus. Electron energy-loss spectroscopy (EELS) on the pillars (lower right inset in FIG. 3C) revealed the presence of a crystalline Si L-edge peak at 100 eV, also seen in the spectrum of the c-Si substrate (upper left inset in FIG. 3D). The small peak at 108 eV (inset of FIG. 3C) arises from Si in the thin $SiO_2$ surface layer that forms in air after HF treatment.

Because nanopores generated through block copolymer self-assembly laterally confine the crystal growth to narrow dimensions, it is possible to heteroepitaxially grow crystals with moderate lattice mismatch on Si. In this way, single-crystal nanostructures (i.e., monocrystalline nanostructures) can be generated that are not easily accessible through etching. To this end, stoichiometric NiSi was sputter-deposited on the porous template (deposition rates were monitored with a crystal monitor) after the native oxide was removed. The NiSi (202) lattice mismatch to Si (220) was 0.5 to 0.6%, and in the absence of lateral confinement, NiSi film deposition on Si leads to multiple lattice orientations and small-island formation, releasing the strain accumulated over larger lateral film distances. The nanoporous NiSi filled films were then laser-irradiated to melt the amorphous NiSi, which subsequently solidified epitaxially from the substrate. The short duration of the melt minimized Ni diffusion or the incorporation of Si from the substrate into the liquid phase, thus maintaining the correct stoichiometry in the pore. The epitaxial orientation of the strained NiSi lattice on the c-Si substrate was confirmed by STEM images of the NiSi/Si interface, with the substrate aligned along the [110] zone axis (FIG. 3E). The EELS spectra collected on the pillar and the substrate clearly indicated the presence of a Ni L-edge peak on the pillar and an absence of Ni below the interface (FIG. 3F). The pore sizes generated through block copolymer self-assembly thus provided the necessary confinement for heteroepitaxy growth on single-crystal substrates for materials with moderate lattice mismatch.

Next examined were the mechanistic aspects of the single-crystal nanopillar formation. A series of experiments was first performed (sample s3) in which the a-Si was deposited without etching the native oxide layer, thereby preventing direct growth from a c-Si substrate. The native oxide layer is expected to prevent molten Si from flowing through the pores, and hence deposited Si should remain confined to the pores (or on top of the template) when melted by the excimer laser pulse. This in turn should result in Si nanopillars of maximum height (~15 nm). This was indeed observed (see the AFM analysis in FIG. 2E). Voronoi analysis of AFM data revealed a 77% pore-to-pillar conversion, with a 22% decrease in the Voronoi-6 ratio (FIG. 2, J and K, sample s3).

For further quantitative data analysis, the radial distribution functions (RDFs) of the AFM images were computed for the parent templates and the resulting Si pillar nanostructures (FIG. 2, L and M). The RDFs of the unirradiated, parent templates exhibited narrow first-order maxima and multiple higher-order peaks. With no deposited films (sample s1), after irradiation the RDF exhibited very similar characteristics, with only slightly less power in each peak because of the slightly reduced ordering. In contrast, samples with deposited films where native oxide was not removed behaved quite differently (sample s3). The RDF of the resulting Si nanopillars exhibited a first-order maximum shifted to larger distances [pillar-to-pillar distance (r)=39 nm] as compared to the template (r=31 nm) and a rapid decay with no additional higher-order peaks. Examination of the AFM image in detail revealed sequences of pillars with the expected nearest-neighbor distance (r=31 nm), surrounded by neighbors with distances closer to the expected second-nearest neighbor value. This suggests that a substantial number of pores simply did not get filled, which is consistent with the 37% loss of centers from the Voronoi analysis. The corresponding RDF maximum indeed lies in between the nearest- and second-nearest-neighbor spacings and may be caused by a slight deformation of the template toward the empty space during melting.

The Si transient melt behavior during laser irradiation was monitored with TRR of samples. When irradiated above the melt threshold, the reflectance of a bare c-Si substrate will jump as the melt first forms, remain constant while the melt front propagates into the substrate, and decrease abruptly only as the surface solidifies (FIG. 4A, I). Increasing the fluence from 700 to 800 mJ/cm2 extends the melt duration (that is, there is a broader reflectance curve) (FIG. 4A, II). Small changes in the reflectance before melting result from simple surface heating. The following three sample structures were investigated: (i) the c-Si substrate with the porous template, (ii) the c-Si substrate with a-Si on top, and (iii) the c-Si substrate with the template and a-Si deposited on top. With just the porous template (case i), the TRR signal remained very similar to that of the bare c-Si substrate, although the melt duration increased by ~8 ns at 800 mJ/cm2 (compare traces in FIG. 4A, II and III). On the time scale of the laser pulse and melt duration, the crosslinked silica-type template does not undergo any substantial structural change. The extended melt duration arises partially from the antireflective nature of the porous template coating, but also suggests the incorporation of a low concentration of impurities (possibly O or Al) during solidification.

Figure 4:
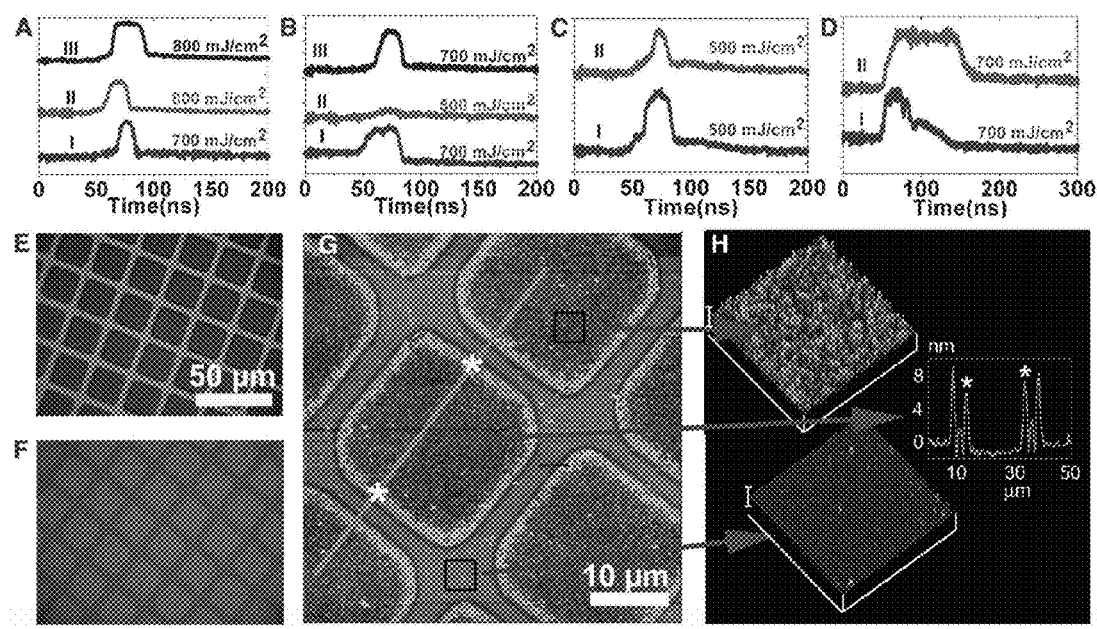
FIG. 4 shows a series of time resolved reflectance (TRR) graphs and electron microscopy images of homoepitaxial silicon nanostructures that may be fabricated in accordance with the first embodiment.

In case ii, with a-Si deposited directly on the c-Si substrate, the TRR signal strongly depended on the fluence (FIG. 4, B and C). With a lower melting temperature, the melt threshold for a-Si is less than that of c-Si. Epitaxial solidification can occur only for fluences sufficient to melt into the c-Si substrate (FIG. 4B), with polycrystalline Si (poly-Si) resulting at lower fluences (FIG. 4C). Transformation of the a-Si could be readily confirmed visually (FIG. 4B, 1I). After irradiation at or above 700 mJ/cm2, samples behaved similar to the bare substrate, with a melt threshold near 600 mJ/cm2 (FIG. 4B, I to III). However, for initial irradiations below the melt threshold for c-Si (e.g., at 500 mJ/cm2), a peak was observed in the TRR signal (FIG. 4C, I). When the spot was irradiated again at this fluence, the peak remained (FIG. 4C, II), indicating the formation of poly-Si structure with lower thermal conductivity.

From these results it is concluded that in order to epitaxially crystallize a-Si deposited in the template pores (case iii), samples had to be irradiated above the melt threshold of c-Si. Upon irradiation (FIG. 4D, I), the reflectance first increased rapidly, then stayed constant, followed by a steep first drop; and finally further decreased gradually over several tens of nanoseconds. The drop in reflectance in two steps is probably due to the different time scales involved for heat transfer from molten Si to the substrate within a pore (faster) and at the top of the template, which is a poor heat conductor (slower). During a second irradiation at the same spot (FIG. 4D, II), the reflectance signal exhibited a single peak and decay, suggesting the absence of Si on top of the template. Because in various experiments more a-Si was deposited than was necessary to fill the pores, one may speculate that this could only happen if the deposited Si on top of the template flowed through the pores to move under the template, displacing the template upward. The poor wetting properties between molten Si and the aluminosilicate template might propel this surface tension-driven flow of molten Si through the template.

Figure 5:
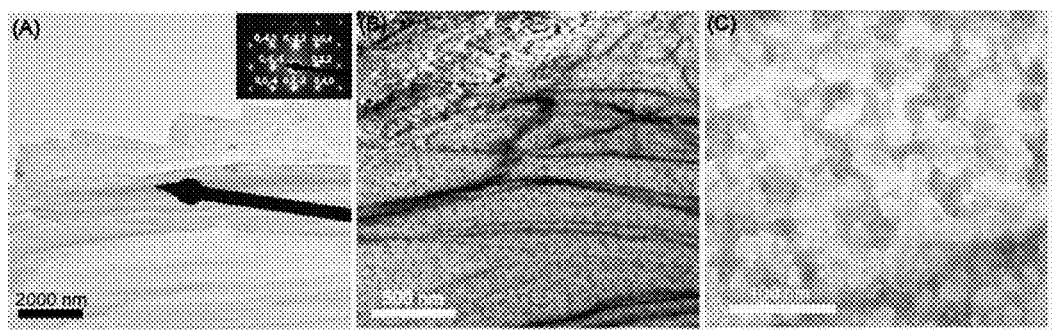
FIG. 5 shows a series of plan-view transmission electron microscopy (TEM) and electron diffraction (ED) images related to the electron microscopy images of FIG. 3.
Figure 6:
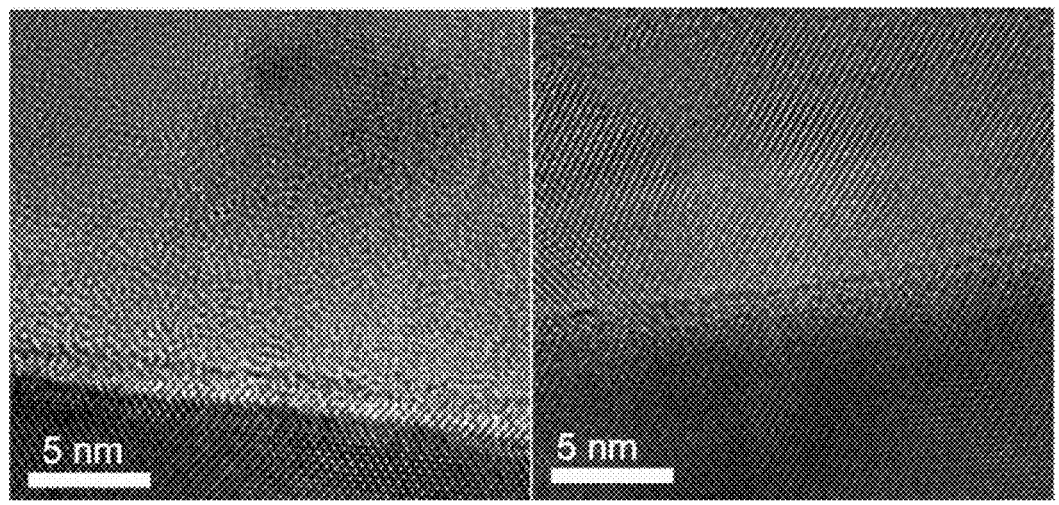
FIG. 6 shows a plurality of transmission electron microscopy images of homoepitaxial silicon nanostructures that may be fabricated in accordance with the first embodiment.

A key step in obtaining single-crystal epitaxy is to remove the native oxide layer to generate a clean interface between deposited amorphous material in a pore and the c-Si substrate. Maintaining this condition should enable the generation of single-crystal epitaxial nanostructures from thicker self-assembled porous templates. Argon ion sputtering removes oxide layers in direct line of sight from the top only. One challenge in working with silica-type structures is the need to remove the native oxide to enable the epitaxial crystallization, while not simultaneously removing the template. In order to work with thicker and more complex-shaped structures, examined was a porous amorphous niobia template coupled with plasma enhanced chemical vapor deposition (PECVD) to fill the porous structures with amorphous inorganic material. FIG. 3G shows SEM images of a roughly 100-nm-thick porous amorphous niobia template with network structure. These templates were generated in a similar way as the aluminosilicate templates, using a poly (isoprene-b-styrene-b-ethylene oxide) (PI-b-PS-b-PEO, ISO) triblock copolymer with a molecular mass of 23,180 g/mol [17.2 volume % (vol %) PEO, 52 vol % PS; polydispersity index=1.11] as structure-directing agent for a niobia sol. The O+oxide volume fraction in the as-made composite was 24%. After spin coating, composite thin films heat-treated to 130° C. were plasma cleaned to remove the organics, resulting in the desired porous nanostructure. The nanopore lattice spacing as revealed by SEM data was 32.5+/−8.5 nm; that is, similar to that of the aluminosilicate templates. FIG. 3H displays SEM images of the resulting porous Si nanostructures after removal of the native oxide with dilute HF, a-Si deposition, laser irradiation with two 40-ns laser pulses of 700 mJ/cm2, and niobia template removal with concentrated HF. The images show that the Si has filled the pores, retaining the ~100-nm-thick template nanostructure. Cross-sectional TEM was performed on this sample to examine the epitaxial relationship between the silicon nanostructure and the substrate. In FIG. 3I, the Si lattice fringes in the porous nanostructure were found to be congruent with the fringes observed in the substrate, confirming the epitaxial correlation also for these thicker films (compare FIG. 3, A and I). Results of TEM imaging after plan-view polishing and electron diffraction on this sample are shown in FIG. 5. Removing the native oxide layer before laser annealing indeed turned out to be a critical step. FIG. 6 shows two cross-sectional images of films etched for different times. When the native oxide was not removed completely (a 20-s etch), the crystal orientation in the film was independent of the substrate orientation and poly-Si formed. Extending the etch to 35 s resulted in single-crystal epitaxy in some regions of the film. In those regions where epitaxy had failed, the thin native oxide layer was still present. To go beyond the laboratory-scale proof of concept presented here, the oxide etchant needs to be able to penetrate small pores more reliably. This can be done with modern gas-phase semiconductor processing technology (with gaseous HF rather than liquid).

Figure 7:
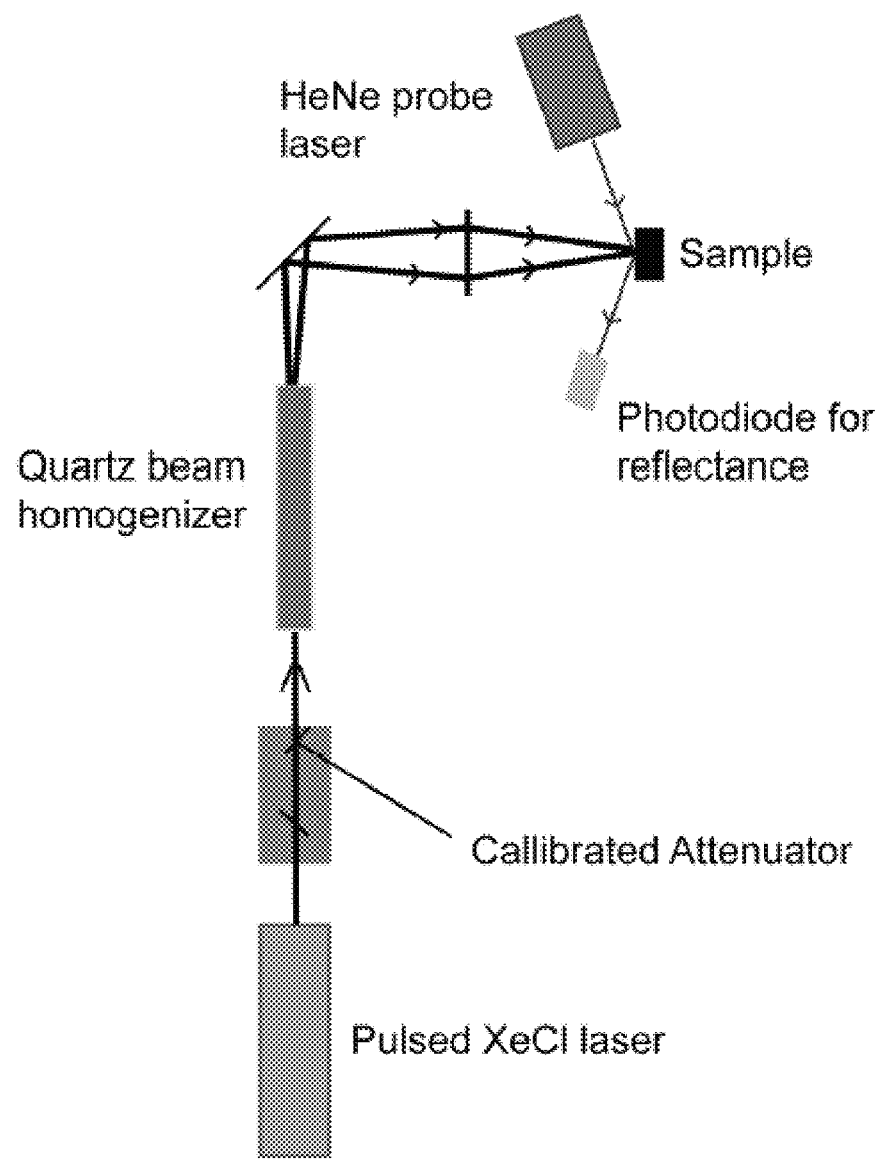
FIG. 7 shows a schematic diagram of a laser irradiation apparatus that may be used for fabricating homoepitaxial silicon nanostructures and heteroepitaxial nickel silicide on silicon nanostructures in accordance with the first embodiment.

Finally, the bottom-up fabrication of epitaxially grown inorganic nanostructures was combined with top-down lithographic approaches to define specific areas, thus providing access to hierarchical nanostructures. As a proof-of-principle experiment, a TEM grid was used as a simple mask during the laser irradiation process to form patterns on a micrometer scale (FIG. 4E). The grid was placed in contact with the sample surface to minimize the loss of fidelity from the divergence of the homogenized incident laser beam (see FIG. 7 for a schematic of the laser setup). The resulting Si pattern after irradiation through the TEM grid (FIG. 4F) indicates remarkable transfer. After template removal by HF, subsequent AFM imaging shows distinct squares of patterned material (FIG. 4G). Close-up images (FIG. 4H) of the square confirm the presence of Si nanostructures in the irradiated area (i.e., "islands" of nanostructures that are intended to include various area geometries) and smooth flat Si in areas under the mask. As the image in FIG. 4G suggests and the AFM cross-sectional analysis confirms (FIG. 4H), the pattern edges of the irradiated areas are markedly higher than the interior of the areas. Despite poorly controlled edge effects, this simple proof-of-principle experiment does demonstrate that the placement of epitaxial single-crystal nanostructures can be controlled through simple imaging methods. Arbitrarily complex shapes should thus be possible to create by leveraging the wealth of patterning techniques currently available.

2. Experimental Materials and Methods

Porous Templates Thin (~15 nm) porous templates were prepared using poly(isoprene-b ethylene oxide) (PI-b-PEO) diblock copolymers A and B with molecular weights of 38,700 g/mol (32 wt. % PEO, polydispersity index <1.1) and 27,300 g/mol (13.6 wt. % PEO, polydispersity index=1.03), respectively, as typically obtained from living (i.e., anionic) polymerization techniques. Pore-pore spacing for monolayer type films from these polymers was ~31 nm (polymer A, samples s1 and s3) and ~35 nm (polymer B, sample s2). Thicker (~100 nm) templates were prepared from a poly(isoprene-b-styrene-b-ethylene oxide) (PI-b-PS-b-PEO, ISO) triblock copolymer with molecular weight 23,180 g/mol (17.2 vol. % PEO, 52 vol. % PS, PDI=1.11) and a niobia sol. The O+oxide volume fraction was 24%. Composite thin films heat treated to 130° C. were plasma cleaned to remove the organics resulting in the desired porous templates.

Oxide Removal and Deposition: Prior to sputter deposition on the templates, the native oxide was removed. For thin (~15 nm) templates this was achieved by in-situ back sputtering with argon ions at a base pressure of $2.3 \times 10^{-7}$ ton for 30 sec at removal rates of 9.55 nm/min. a-Si was sputtered in the same chamber and at the same base pressure for 85 sec at deposition rates of 12 nm/min. 12 nm of thermally evaporated a-Si was deposited on sample s3 under ultrahigh vacuum without removing the native oxide. Stoichiometric NiSi was sputter deposited at base pressure of $2.3 \times 10^{-7}$ ton for 26 sec at deposition rates of 18.6 nm/min. For thicker (~100 nm) templates the native silicon oxide was removed by dipping samples in diluted HF (100:1) solution for 10-50 seconds. Subsequent deposition of 75 nm of Si was achieved on these samples using PECVD at 400° C.

Laser Irradiation: A 40 ns pulse duration XeCl excimer (308 nm) laser was used to melt Si. Reflectance of the sample surface was monitored using a 650 nm diode laser. The laser irradiated area on the sample was 3.2×3.2 mm2. Energy densities are referenced to a melt fluence of 600 mJ/cm2 for bare single crystal Si wafers. Four irradiations at an energy density of 700 mJ/cm2 were used to melt the Si in thin (~15 nm) samples s2 and s3. Sample s1 was irradiated five times at an energy density of 800 mJ/cm2. The NiSi samples were annealed once at an energy density of 550 mJ/cm2. For thicker (~100 nm) films two laser pulses at 700 mJ/cm2 were used to melt the silicon into the niobia template.

Template Removal: Samples were treated with 48% HF acid for 1-2 minutes to remove the templates.

Characterization: Atomic Force Microscopy (AFM) images were captured on a Veeco Nanoscope III in tapping mode with TappingMode Etched Si probes (resonance frequency=325 kHz, force constant=37 N/m, tip radius of curvature=10 nm; all values nominal) under ambient conditions. A LEO 1550 Field Emission SEM was used with an In-lens detector at 5 KeV to image thin films. High resolution transmission electron microscopy (HRTEM) and scanning TEM (STEM) were performed on a FEI Tecnai F20 TEM operated at 200 keV. Electron diffraction was performed on a FEI Tecnai T12 TEM operated at 120 KeV.

TEM Sample Preparation: For cross-section S/TEM analysis of Si pillars in FIG. 3A-D samples were prepared by a wedge-polishing and ion-milling method. For thicker Si nanostructures in FIGS. 3I and 6 (see below) samples were prepared by focused ion beam (FIB) and combined wedge-polishing and ion-milling, respectively. Prior to polishing a bare Si piece was glued to the sample surface to prevent any damage to the nanostructures occurring throughout the preparation processes. Samples for the electron diffraction experiments (FIG. 5) were prepared by plan-view wedge-polishing. For the cross-section TEM analysis of the NiSi (FIG. 3E) and thicker nanostructured Si (FIG. 3I) films, samples were prepared using a FEI Strata 400 focused ion beam. A protective carbon and platinum layer was deposited before milling the sample to protect the film from milling damage.

3. Features and Advantages

The embodiments thus provide a bottom-up approach that leverages the natural self-assembly of block-copolymers to form complex nanoscale interpenetrating networks. Control of the morphology, size scales and relative fractions of the interpenetrating networks are determined by the organic precursors. Moreover, the embodiments provide the ability to form nanostructures from either the substrate material or any compatible material that can be deposited on the template by sputtering, evaporation, CVD, PECVD, electroplating, etc.

The embodiments also provide for control of the epitaxial relationship of the film. Homoepitaxial or heteroepitaxial relationship of the porous nanostructured films to the substrate can be achieved by initiating solidification from the underlying substrate. The embodiments provide for growth of complex interpenetrating networks of either unaligned or epitaxially aligned nanoporous films. The template can be formed in a variety of complex 3D structures ranging from oriented cylinders to gyroids limited only by the constraint that both the direct and inverse structures must be "connected" and self-supporting. With the epitaxial alignment to the substrate, these are essentially extensions of the substrate and retain the desired properties of single crystals including electron mobility for carrier transport. The extremely large surface area of the nanoporous films are then available for such applications as catalysis or charge collection. No other method for producing such single crystal porous films with controlled morphologies is readily apparent.

The embodiments provide an ability to bypass the conventional Matthews-Blakslee limit for thin film heteroepitaxial growth by nanoporous templating. As the heteroepitaxial growth occurs only in the pore area (20 nm diameter), misfit dislocations do not have sufficient area to form and the films will grow pseudomorphically through the pore. Gradual relaxation of the lattice strain results in unstrained films on the surface of the template which then coalesce into a unstrained single crystal of the desired material. This permits, for example, growth of unstrained Ge on Si which could then be used as a template for GaAs growth.

The embodiments provide multiscale patterning capability. The bottom-up templating can be combined with top-down lithographic patterning or selected area irradiation of the laser to produce films with structure on multiple length scales.

The specific embodiments as described above use a laser source for the induced melting. This could readily be a pulsed ion source or other energetic sources. In addition, given the relative stability of the templating films, more continuous melting is also possible up to the millisecond time regime. The limit is the collapse of the templating structure.

Growth may also proceed epitaxially on lower temperature substrates through other growth methods including solution or gas phase methods.

4. Potential Applications a. Electronics

In the microelectronics industry, epitaxial films on Si are highly desirable to maintain performance. Specific applications of the embodiments may be as follows:

3D Electronics: Homoepitaxial growth of Si through nanopores with subsequent lateral film growth permits fabrication of a second "layer" of electronic devices. Even more so, heteroepitaxial growth of Ge pseudomorphically without misfit dislocations would allow the subsequent level to be fabricated at lower temperatures to prevent deterioration of the initial layer.

Growth of Epitaxial Contact Metallurgies: Demonstrated is oriented crystal growth of NiSi through pores using near-stoichiometric deposited NiSi. Epitaxy would reduce the contact resistance resulting in higher performance devices.

Potential for Integration of Optical Materials in Si: Growth of optically active materials such as GaAs are limited by the lattice mismatch with Si. Epitaxial growth of Ge through nanopores to a fully relaxed film would then enable direct growth of GaAs on the Ge (lattice matched) and integration of lasers and detectors to resolve issues with interconnect density, speed and skew.

Growth of Porous Single-Crystal Si on Surfaces for Sensor Applications: The single crystal link to the substrate coupled with the large surface area permits integration of chemical sensors with extremely high sensitivity. Also considered is generic growth of new materials on Si substrates to integrate with microelectronics devices in sensor and control applications.

b. Photovoltaic Cells

Embodiments may be applicable to surface nanostructuring of conventional Si solar cells for light trapping, as well as controlled scales to optimize black surfaces, thus providing direct formation of Si PV cells within the nanoporous films. Embodiments may also provide for controlled doping of a network after formation develops p-n junctions with charge collection through a second phase and a substrate.

The nanoporous nature of thick films with a single crystal matrix makes them ideally suited as charge collectors in DSSC (dye-sensitized solar cells) and as growth platforms for thin film CPPV (conjugated-polymer PV). As the growth does not depend on the doping of the materials (Si, Ge), the work function of the film can be readily controlled to match system requirements.

The large surface areas and scale can be controlled to match the exciton scale in these PV systems.

Embodiments may also provide a template for growth of nanograss for light trapping solar cells.

c. Chemical Sensors

The flexibility of the fabrication method permits a wide range of materials to be formed as these nanoporous films with few temperature or processing environment restrictions (as compared to other directed self-assembly methods). The films hence can be optimized for functionalization to specific chemicals or antigens.

d. Battery and Capacitor Electrodes

Achieving extremely high surface areas with high conductivity are also common requirements in both batteries (electrodes) and capacitors (charge storage area). For capacitors, metals such as Ta could be used for electrolytic cells. In Li batteries, improved current densities can be achieved by decreasing the transport distance for either $Li^+$ ions or from efficient charge collection and transport.

e. Metaoptical Materials

The effective index of the films can be controlled through selection of the two components in either an air/dense phase or dense/dense phase structure. This can be combined with top-down lithographic patterning and modulation to form active structures for direction of light.

f. Novel Electronic Materials

Several of the morphologies produced by the block-copolymer self-assembly are themselves crystals with large lattice constants. Formation of dense "bi-phase" crystals at these wavelengths from interpenetrating two materials would give rise to new band structures on these length scales. An example would be a hierarchically structured Si—Ge metamaterial with compositional modulation on length scales comparable to the electron mean free path.

B. Second Embodiment

1. Experimental Observations

Figure 8:
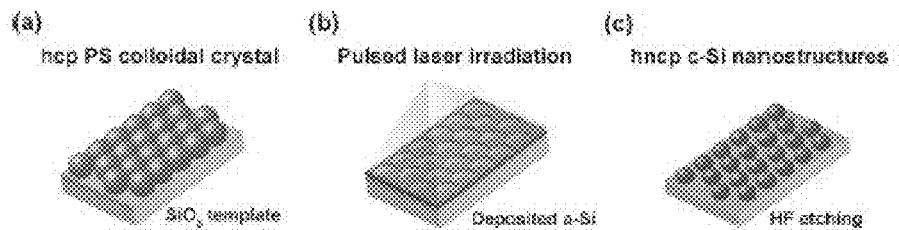
FIG. 8 shows a schematic diagram of a reaction scheme in accordance with a second embodiment.

FIG. 8a to FIG. 8c illustrate an experimental processes sequence in accordance with a second embodiment. Polystyrene (PS) colloids (0.5 wt %) with diameters of either 530 or 350 nm were mixed with deionized water and hydrolyzed tetraethylorthosilicate (TEOS) solution. A monolayer colloidal crystal of PS spheres surrounded by TEOS-derived $SiO_2$ was formed using a flow-controlled vertical deposition (FCVD) method (see, e.g., Zhou, Z.; Zhao, X. S. Opal and Inverse Opal Fabricated with a Flow-Controlled Vertical Deposition Method. Langmuir 2005, 21, 4717-4723; Tan, K. W.; Li, G.; Koh, Y. K.; Yan, Q.; Wong, C. C. Layer-by-Layer Growth of Attractive Binary Colloidal Particles. Langmuir 2008, 24, 9273-9278; and Tan, K. W.; Koh, Y. K.; Chiang, Y.-M.; Wong, C. C. Particulate Mobility in Vertical Deposition of Attractive Monolayer Colloidal Crystals. Langmuir 2010, 26, 7093-7100). The resulting latex beads were slowly calcined in air at 500 C, leaving behind a highly ordered hcp $SiO_2$ inverse monolayer colloidal crystal. This inorganic template was subsequently filled with a ~100 nm thick a-Si overlayer by sputter deposition or plasma-enhanced chemical vapor deposition (PECVD) and irradiated with a 40 ns full-width-half-maximum pulsed XeCl excimer laser (308 nm wavelength) in air to induce the melt conversion of a-Si to the crystalline phase. The entire duration of laser-induced melt and solidification was approximately 20-100 ns. Finally, the $SiO_2$ template was removed in concentrated hydrofluoric (HF) acid solution, leaving the hncp Si nanostructured array seen in FIG. 8c.

Figure 9:
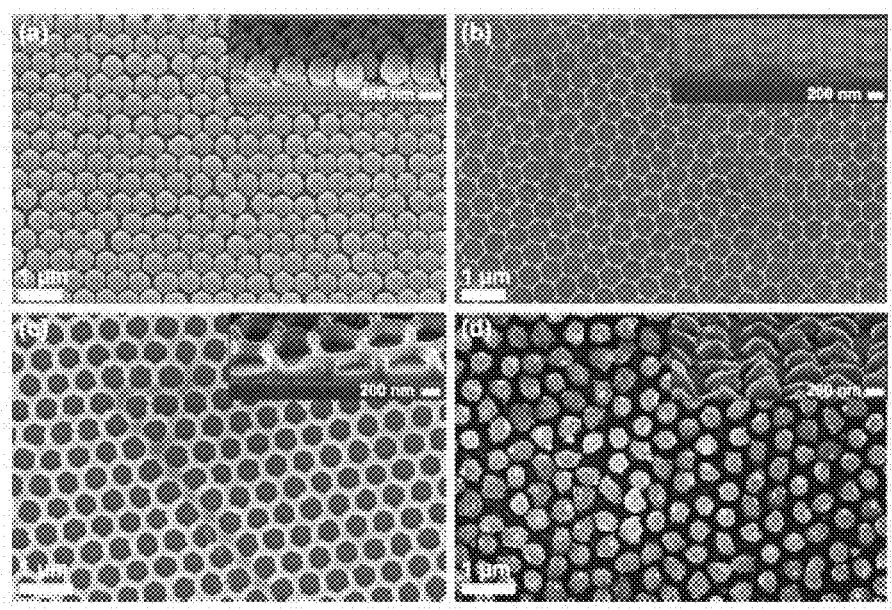
FIG. 9 shows a series of plan-view and cross-sectional diagrams of a sputter deposited sample in accordance with the second embodiment.

Scanning electron microscopy (SEM) images in FIG. 9 show the various stages of the process as described above. A hcp $SiO_2$ inverse template (530 nm pore size, FIG. 9b) obtained from PS monolayer colloidal crystal surrounded by a SiO2 matrix (FIG. 9a) was filled with ~100 nm of a-Si by top-down sputter deposition (FIG. 9c). Melt of the a-Si overlayer was induced by a single 308 nm laser pulse at the single-crystal Si melt threshold of 600 mJ/cm$^2$ and rapidly solidified after 30 ns. The $SiO_2$ template is transparent at this wavelength, and the laser irradiation energy is absorbed solely by Si. c-Si is formed when a-Si melts and solidifies as may be confirmed by characteristic time-resolved reflectance measurements which are not otherwise shown. From FIG. 9d the long-range hexagonal order of the resulting ncp c-Si nanostructured arrays was largely preserved after removing the template in an HF acid solution.

One may postulate the c-Si nanostructure assumed the observed teardrop shape due to a combination of template dewetting and the rapid solidification process. Upon irradiation, a-Si in the $SiO_2$ pore melts and diffuses radially to the center driven by template dewetting. The molten Si would attempt to form a hemispherical shape to minimize a surface tension. However, during this extremely short melt duration, the liquid Si (density of 2.53 g/cm$^3$) expands upon solidification (density of 2.30 g/cm$^3$) and perturbs the adjacent liquid Si, creating capillary waves. These molten capillary waves are confined between coalescing solid grain boundaries from all directions and frozen into protruding ridge and hillock features with a teardrop shape as a result of heterogeneous nucleation and growth mechanism. One may also observe interconnected nanostructures (e.g., see lower left corner in FIG. 9d) that may be attributed to insufficient driving force and the ultrashort time scale for the liquid Si to dewet completely into the pores. From SEM data, the c-Si nanostructures are smaller than the pores, with an average width and height of around 410 and 300 nm, respectively, consistent with other experimental observations.

Figure 10:
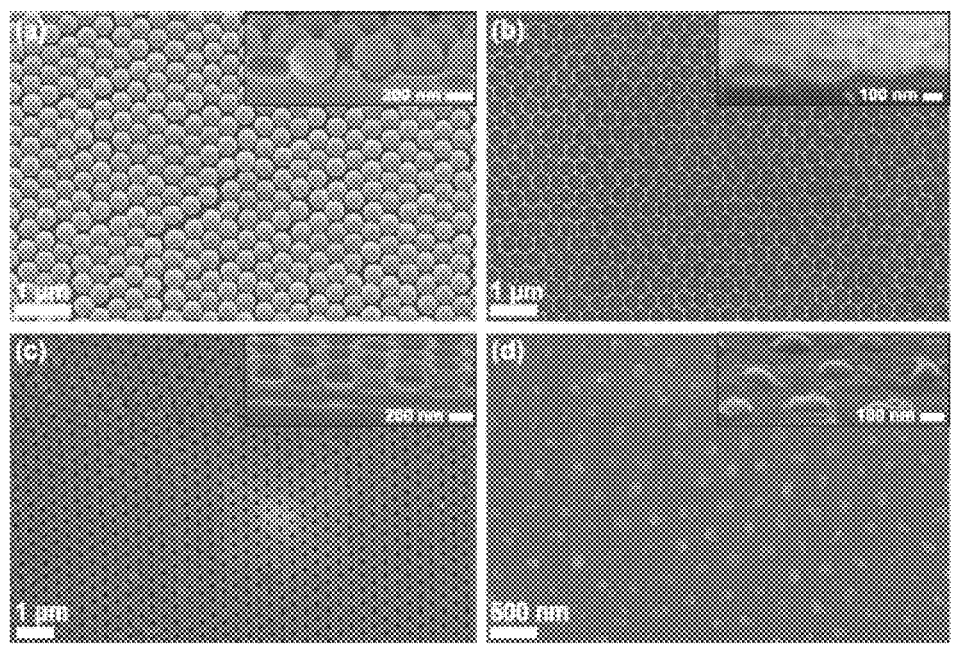
FIG. 10 shows a series of plan-view and cross-sectional diagrams of a plasma enhanced chemical vapor deposited sample in accordance with the second embodiment.

SEM results from a smaller, 350 nm PS colloidal template (FIG. 10a) are shown in FIG. 10. A ~100 nm thick a-Si film was deposited into the smaller $SiO_2$ inverse monolayer colloidal crystal template (FIG. 10b) using PECVD. FIG. 10c depicts hydrogenated a-Si deposited conformally within the pores and on the walls of the $SiO_2$ template. Due to the presence of hydrogen in PECVD a-Si films, microscopic blistering of the surface is observed for films irradiated at high fluences due to the explosive release of the trapped gas upon melting. Alternatively, the hydrogenated a-Si films were irradiated with four sequential laser pulses at 500-700 mJ/cm$^2$, generating a more controlled and stepwise heating and release of hydrogen. The resulting hncp c-Si nanostructures imaged in FIG. 10d with SEM and FIG. 11b with atomic force microscopy (AFM) exhibit an average width of around 170 nm and height of 60-70 nm.

Figure 11:
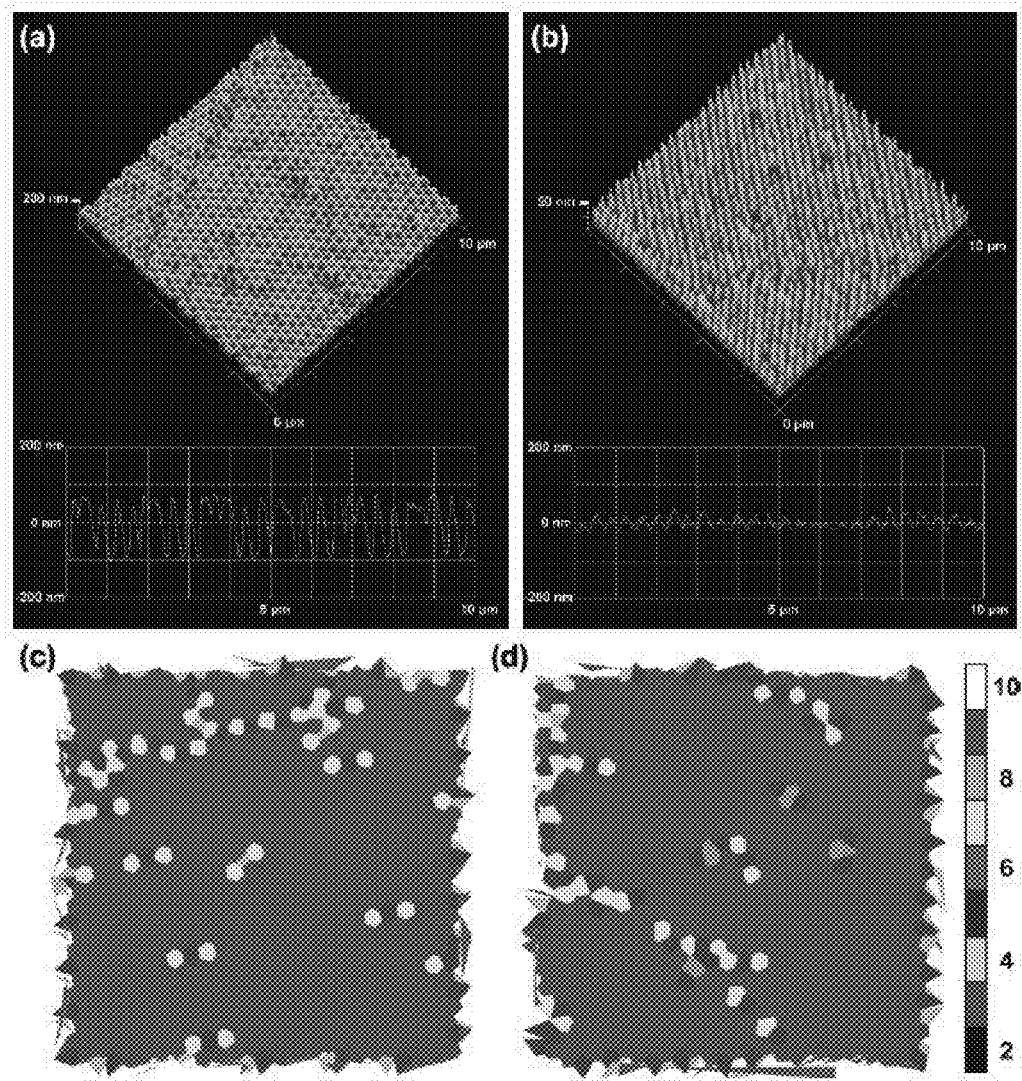
FIG. 11 shows a series of AFM height profile and Voronai diagrams in accordance with the second embodiment.

FIG. 11 shows AFM height profile images and corresponding Voronoi tessellation constructions of both the hcp $SiO_2$ template and hncp c-Si nanostructured arrays resulting from the laser-induced melting and solidification process. An n-sided polygon represents a $SiO_2$ template pore or c-Si nanostructure at the center having an equivalent n number of nearest neighbors. The majority green-colored (i.e., darker in gray scale) hexagon (6-fold) spatial areas in the Voronoi diagrams contain a total of 577 six-coordinated template pores (FIG. 11c) and 571 six-coordinated c-Si nanostructures (FIG. 11d) over a scan area of 10×10 μm2. Both the AFM results and Voronoi diagrams affirm quantitatively the hexagonal pattern transfer from the cp $SiO_2$ inverse colloidal template to the ncp c-Si nanostructures with almost 100% fidelity.

Figure 12:
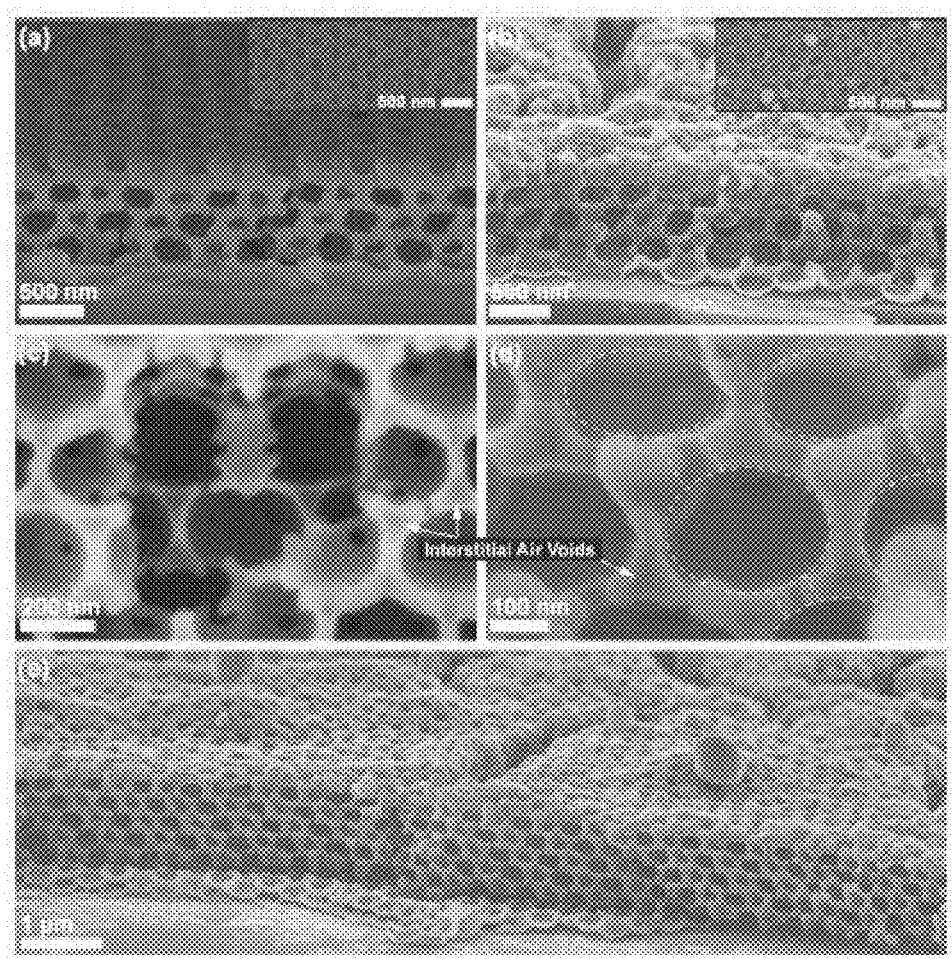
FIG. 12 shows a series of plan-view and cross-sectional diagrams of nanostructures in accordance with the second embodiment.

Beyond two dimensions, one may use the laser-induced transient melt process in accordance with the embodiments to obtain 3D ordered macroporous (3DOM) c-Si inverse opals with hncp symmetry based on micromolding in inverse silica opals (MISO). One may begin with a multi-layered $SiO_2$ inverse opal prepared by the FCVD method with 350 nm PS beads. FIG. 12a shows the uniform deposition of hydrogenated a-Si by PECVD on the inner walls of the $SiO_2$ interconnected spherical cavities, yielding an hncp $SiO_2$/a-Si core-shell inverse colloidal crystal. The $SiO_2$/a-Si composite material was subsequently irradiated with a total of 43 sequential laser pulses at fluences from 5-550 mJ/cm$^2$. The low-energy fluencies allowed for a slow and controlled release of hydrogen, while higher energies induced melt and converted the a-Si into c-Si, retaining the inverse opal morphology. The open structure and $SiO_2$ template walls reduced the melt threshold from 600 to 550 mJ/cm$^2$. Selective HF etching of the $SiO_2$ template results in an all c-Si single network of hncp inverse opal morphology seen with four- and six-monolayer periodicities in FIG. 12b and e, respectively. Energy dispersive X-ray (EDX) analysis indicates that the resulting laser-induced c-Si 3DOM material consists almost entirely of silicon (<9% residual oxygen content, data not shown).

FIG. 12c and d display high-magnification SEM micrographs of a-Si and c-Si inverse opals after HF etching, respectively. The darker contrast of the interstitial sites between three interconnecting quasi-spherical shells in both images suggests the placement of air voids that were formed after the removal of $SiO_2$ template and explicitly confirmed in the interior view of the a-Si inverse opal (FIG. 12c). The white-dotted regions in FIG. 12d highlight the quasi-cylindrical air channels connected to the quasi-spherical c-Si shells, a distinctive feature of hncp inverse opals. From the SEM data, the quasi-spherical pore size in the laser induced c-Si inverse opal material was reduced up to 40%, which can be attributed to the shrinkage of the $SiO_2$ template during calcination and the thicker Si walls. This shrinkage is crucial to obtain the ncp symmetry. An interesting feature in the 3DOM nanostructures is the absence of dewetting of the molten Si from the $SiO_2$ pore walls. In contrast to the 2D nanoarrays, the absence of a clearly preferable single-crystal Si substrate could have resulted in the uniform a-Si melting within the porous structure.

For complete shape and structural control, one may need to either fully dehydrogenate the PECVD a-Si film, deposit gas-free amorphous precursors, or irradiate in situ after deposition to reduce the total number of laser pulses and accumulated silicon melt duration. One may postulate the best method is to achieve homogeneous nucleation and epitaxial growth of a single-crystal silicon nanostructure from the substrate. In particular, one may expect an interconnected and epitaxial ncp single-crystal 3D structure to facilitate optimal electrical charge transport properties and impart improved mechanical properties from the lack of grain boundaries. In analogy to results on block copolymer templates, this approach may be applied to form not only single-crystal homoepitaxial but also heteroepitaxial ncp nanostructured arrays on Si, enabling new functionalities and the engineering of novel device prototypes.

In conclusion, experiments have been performed to demonstrate a highly rapid and versatile method using colloidal crystal templates coupled with pulsed excimer laser-induced melting to obtain ncp c-Si arrays of varying scales at ambient conditions. The resulting hncp c-Si nanostructured arrays maintain uniform separations and excellent long-range order as established by the hcp colloidal crystal template. The results suggest a general strategy coupling softmatter self-assembly with pulsed laser irradiation to direct and design intricate complex nanopatterned crystalline inorganic materials that could be used in advanced applications such as sensors, catalysis, and energy conversion.

2. Experimental Methods and Materials

Colloidal Crystal Template Synthesis.

PS colloids with diameters of 530 and 350 nm from Interfacial Dynamics and PolySciences, respectively, were used as received. Colloidal suspensions of 0.5 wt % were mixed in deionized water and hydrolyzed TEOS solution (TEOS/0.1 M HCl/EtOH, 1:1:1.5 by weight). Si substrates used were cleaned with piranha solution (H2SO4/H2O2, 3:1 by volume) and rinsed profusely with deionized water before use. The PS colloidal crystal and surrounding $SiO_2$ matrix were grown on these substrates using the FCVD method. The PS beads were removed by slow calcination at 500 C for 2 h at a ramp rate of 2 C/min in air. TEOS (98%, Sigma-Aldrich), HCl acid (37%, VWR), absolute EtOH (Pharmco), $H_2SO_4$ acid (97%, VWR), and $H_2O_2$ (30%, VWR) were used as received.

a-Si Deposition.

a-Si was sputter-deposited into the 530 nm $SiO_2$ monolayer inverse opal template using a rf magnetron source with argon ions at a base pressure of $1.9 \times 10^{-6}$ torr and deposition rate of 9.8 nm/min for 10 min. a-Si was deposited into the 350 nm $SiO_2$ monolayer inverse opal template by PECVD at 400 C for 2.2 min with a deposition rate of 46 nm/min. a-Si was deposited into the (350 nm) multilayered $SiO_2$ inverse opal template by PECVD at 400 C for 3.3 min with a deposition rate of 46 nm/min.

Excimer Laser Irradiation.

Briefly, a 40 ns full-width-half-maximum pulsed XeCl excimer laser (308 nm wavelength) was used to melt the a-Si in the $SiO_2$ template. Reflectance of the sample surface was monitored using a 650 nm diode laser. The laser irradiated area on the sample was 3.2×3.2 mm. A single laser pulse of 600 mJ/cm2 energy fluence was used to melt the 530 nm sputter-deposited a-Si monolayer sample. Four sequential laser pulses of 600, 700, 700, and 500 mJ/cm2 energy fluences were used to melt the 350 nm PECVD a-Si monolayer sample. A total of 43 sequential laser pulses at fluences from 5 to 550 $mJ/cm^2$ were used to dehydrogenate and melt the 350 nm PECVD a-Si multilayered sample.

Template Removal.

The sputter-deposited samples were treated in 20% HF acid solution, and PECVD samples were treated in 49% HF acid solution for 3-5 min to completely dissolve the $SiO_2$ templates.

Characterization.

AFM images were obtained on a Veeco Nanoscope III in tapping mode with TappingMode Etched Si probes (325 kHz resonance frequency, 27 N/m force constant, 10 nm tip radius of curvature; all other values nominal) at ambient conditions. A LEO 1550 field emission SEM equipped with an in-lens detector and an EDX spectrometer (Quantax EDS, XFlash 3000 silicon drift detector, Bruker Nano GmbH) was used to image and identify the EDX signals of the samples. Voronoi tessellation diagrams were constructed using a self written algorithm.

All references, including publications, patent applications, and patents cited herein are hereby incorporated by reference in their entireties to the same extent as if each reference was individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it was individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

The embodiments of the invention are thus illustrative of the invention rather than limiting of the invention. Revisions and modifications may be made to methods, materials, structures and dimensions of a nanostructure or related method in accordance with the embodiments while still providing a nanostructure or related method in accordance with the invention, further in accordance with the accompanying claims.

What is claimed is:

1. A nanostructure comprising:
monocrystalline substrate comprising a first monocrystalline material having a first crystal structure; and
a plurality of monocrystalline pillars located epitaxially aligned with, extending contiguously from, and directly contacting the monocrystalline substrate, each of the plurality of monocrystalline pillars comprising a second monocrystalline material having a height above the Matthews-Blakeslee limit for thin film heteroepitaxial growth for the second monocrystalline material and bulk second crystal structure with a lattice mismatch of +/−0.1 to about 10.0 percent with respect to the first crystal structure, absent any lattice mismatch induced crystal structure defects interposed between the monocrystalline substrate and the plurality of epitaxially aligned contiguous monocrystalline pillars,
wherein each of the plurality of monocrystalline pillars is formed by a single-step energetic treatment comprising a fluence that is sufficient to melt and rapidly cool the first monocrystalline material of, at least in part, an upper surface of the monocrystalline substrate exposed through a plurality of pores disposed within a template layer located on an upper surface of the monocrystalline substrate, wherein the height is from 1 micron to 10 microns, and the template layer located on the upper surface of the monocrystalline substrate is formed by a self-assembling polymer to generate the plurality of pores.

2. The nanostructure of claim 1 wherein each of the plurality of monocrystalline pillars has a linewidth dimension from about 5 to about 50 nanometers and a separation distance from about 5 to about 100 nanometers.

3. The nanostructure of claim 1 wherein each of the plurality of monocrystalline pillars has a linewidth dimension from about 10 to about 30 nanometers and a separation distance from about 10 to about 50 nanometers.

4. The nanostructure of claim 1 wherein:
the monocrystalline substrate comprises a semiconductor substrate; and
each of the plurality of monocrystalline pillars comprise a metal silicide material.

5. The nanostructure of claim 1 wherein:
the monocrystalline substrate comprises a first semiconductor material; and
each of the plurality of monocrystalline pillars comprise a second semiconductor material different than the first semiconductor material.

6. The nanostructure of claim 1 wherein each of the plurality of monocrystalline pillars is arranged in islands of pillars that are epitaxially aligned to and extending contiguously from the monocrystalline substrate.

7. The nanostructure of claim 1 wherein the bulk second crystal structure has a lattice mismatch from about +/−5.0 percent to about 10.0 percent with respect to the first crystal structure.

8. The nanostructure of claim 1 wherein the bulk second crystal structure has a lattice mismatch of +/−0.1 percent to about 4.0 percent with respect to the first crystal structure.

9. The nanostructure of claim 1, wherein each of the plurality of monocrystalline pillars is arrayed in a hexagonal pattern.

10. The nanostructure of claim 1, wherein each of the plurality of monocrystalline pillars extending contiguously from the monocrystalline substrate comprise a common width, and is laterally spaced from each other by a uniform distance.

11. The nanostructure of claim 1, wherein the monocrystalline substrate and each of the plurality of monocrystalline pillars comprise the same material.

12. The nanostructure of claim 1, wherein the fluence of the single pulsed-laser irradiation step utilized is between 500 mJ/cm$^2$ and 700 mJ/cm$^2$.

13. The nanostructure of claim 1, further comprising a microporous template layer disposed on the upper surface of the monocrystalline substrate.

14. A nanostructure comprising:
a monocrystalline substrate comprising a first monocrystalline material having a first crystal structure; and
a plurality of monocrystalline pillars located epitaxially aligned with, extending contiguously from, and directly contacting the monocrystalline substrate, each of the plurality of monocrystalline pillars comprising a second monocrystalline material having a height above the Matthews-Blakeslee limit for thin film heteroepitaxial growth for the second monocrystalline material and a bulk second crystal structure with a lattice mismatch of +/−0.1 to about 10.0 percent with respect to the first crystal structure, absent any lattice mismatch induced crystal structure defects interposed between the monocrystalline substrate and the plurality of epitaxially aligned contiguous monocrystalline pillars, wherein the height is from 1 micron to 10 microns, and the template layer located on the upper surface of the monocrystalline substrate is formed by a self-assembling polymer to generate the plurality of pores.

15. The nanostructure of claim 14 wherein each of the plurality of monocrystalline pillars comprises irregular sidewall shaped monocrystalline pillars.

16. The nanostructure of claim 15 wherein the monocrystalline substrate and each of the plurality of monocrystalline pillars comprise the same material.

17. The nanostructure of claim 15 wherein the monocrystalline substrate and each of the plurality of monocrystalline pillars comprise different materials.

18. The nanostructure of claim 15 wherein each of the plurality of irregular sidewall shaped monocrystalline pillars includes other than straight sidewalls.

19. The nanostructure of claim 15 wherein each of the plurality of irregular sidewall shaped monocrystalline pillars includes non-smooth sidewalls.

20. The nanostructure of claim 15, wherein the plurality of irregular sidewall shaped monocrystalline pillars in an aggregate provide a nanostructured porous layer of circuitous porosity.

21. The nanostructure of claim 15, further comprising a microporous template layer disposed on the upper surface of the monocrystalline substrate.

22. The nanostructure of claim 14, wherein the fluence of the single pulsed-laser irradiation step utilized is between 500 mJ/cm$^2$ and 700 mJ/cm$^2$.

23. A nanostructure comprising:
- a monocrystalline substrate comprising a first monocrystalline material having a first crystal structure; and
- a plurality of monocrystalline pillars located epitaxially aligned with, extending contiguously from, and directly contacting the monocrystalline substrate, each of the plurality of monocrystalline pillars comprising a second monocrystalline material having a height above the Matthews-Blakeslee limit for thin film heteroepitaxial growth for the second monocrystalline material and bulk second crystal structure with a lattice mismatch of +/−0.1 to about 10.0 percent with respect to the first crystal structure, absent any lattice mismatch induced crystal structure defects interposed between the monocrystalline substrate and the plurality of epitaxially aligned contiguous monocrystalline pillars,
- wherein each of the plurality of monocrystalline pillars is formed by a single-step energetic treatment comprising a fluence that is sufficient to melt and rapidly cool the first monocrystalline material of, at least in part, an upper surface of the monocrystalline substrate exposed through a plurality of pores disposed within a template layer located on an upper surface of the monocrystalline substrate, wherein the height is from 1 micron to 10 microns, and each of the plurality of monocrystalline pillars comprises irregular sidewalls.

24. The nanostructure of claim 23, wherein at least some of the plurality of irregular sidewalls are non-smooth sidewalls.

* * * * *